United States Patent
Sanduleanu

(10) Patent No.: US 9,354,266 B2
(45) Date of Patent: May 31, 2016

(54) UNIVERSAL JITTER METER AND PHASE NOISE MEASUREMENT

(75) Inventor: Mihai A. Sanduleanu, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 752 days.

(21) Appl. No.: 13/491,210

(22) Filed: Jun. 7, 2012

(65) Prior Publication Data

US 2013/0332096 A1 Dec. 12, 2013

(51) Int. Cl.
| G01R 29/26 | (2006.01) |
| G01R 31/00 | (2006.01) |
| G01R 31/26 | (2014.01) |
| G01R 31/317 | (2006.01) |
| G01R 31/3167 | (2006.01) |
| G01R 31/333 | (2006.01) |

(52) U.S. Cl.
CPC .............. *G01R 29/26* (2013.01); *G01R 31/001* (2013.01); *G01R 31/2646* (2013.01); *G01R 31/31709* (2013.01); *G01R 31/3167* (2013.01); *G01R 31/333* (2013.01)

(58) Field of Classification Search
CPC .. G01R 29/26; G01R 31/001; G01R 31/2646; G01R 31/31709; G01R 31/2864; G01R 31/3167; G01R 31/333
USPC ..................................... 702/69; 324/613–614
See application file for complete search history.

(56) References Cited

U.S. PATENT DOCUMENTS

| 4,654,861 | A | 3/1987 | Godard |
| 4,818,950 | A * | 4/1989 | Ranger .......................... 327/157 |
| 5,757,652 | A | 5/1998 | Blazo et al. |
| 5,828,255 | A | 10/1998 | Kelkar et al. |
| 6,240,130 | B1 | 5/2001 | Burns et al. |
| 6,366,631 | B1 | 4/2002 | Nakayama et al. |
| 6,778,026 | B2 | 8/2004 | Cheah et al. |
| 7,564,897 | B2 | 7/2009 | Ichiyama et al. |
| 8,224,606 | B2 * | 7/2012 | Leitch ............................. 702/89 |
| 2002/0136337 | A1 | 9/2002 | Chatterjee et al. |
| 2008/0218229 | A1 | 9/2008 | Cranford et al. |
| 2009/0154300 | A1 | 6/2009 | Tabatabaei |

OTHER PUBLICATIONS

Hsu, J., et al. "BIST for Measuring Clock Jitter of Charge-Pump Phase-Locked Loops" IEEE Transactions of Instrumentation and Measurement, vol. 57, No. 2. Feb. 2008. pp. 276-285.
IBM. "PLL With Jitter Measurement BIST" Prior Art Database. Copyright IP.com, Inc. Oct. 2005.

(Continued)

*Primary Examiner* — John Breene
*Assistant Examiner* — Lynda Dinh
(74) *Attorney, Agent, or Firm* — Michael LeStrange; Hoffman Warnick LLC

(57) ABSTRACT

A device and method for measuring jitter includes a capacitive element capable of being selectively charged, wherein the selection is made by a received signal from which an accumulated jitter value is to be determined. An analog-to-digital converter is coupled to the capacitive element to determine a voltage across the capacitive element after a number of cycles of the received signal. A determination module is coupled to the analog-to-digital converter to output the accumulated jitter value of the received signal using the voltage, wherein the accumulated jitter value is accumulated over the number of cycles.

22 Claims, 3 Drawing Sheets

(56) References Cited

OTHER PUBLICATIONS

Taylor, K., et al. "Special Issue on Bit CMOS Built-In Test Architecture for High-Speed Jitter Measurement" IEEE Transactions on Instrumentation and Measurement, vol. 54, No. 3. Jun. 2005. pp. 975-987.

Xia, T., et al. "Time-To-Voltage Converter for On-Chip Jitter Measurement" IEEE Transactions on Instrumentation and Measurement, vol. 52, No. 6. Dec. 2003. pp. 1738-1748.

* cited by examiner

UNIVERSAL JITTER METER AND PHASE NOISE MEASUREMENT

BACKGROUND

1. Technical Field

The present invention relates to the measurement of jitter and phase noise, and more particularly to a universal jitter meter and phase noise measurement for a second order phase-locked loop.

2. Description of the Related Art

Phase noise of a phase-locked loop (PLL) and a voltage-controlled oscillator (VCO) is measured using an on-chip spectrum analyzer, which involves the use of analog-to-digital converters (ADC), fast Fourier transforms (FFT) and discrete Fourier transforms (DFT). For very sensitive on-chip measurements, subsystems with a large dynamic range are needed. If the VCO and PLL run at a high frequency, direct observation of phase noise requires low noise mixers and long delay lines for higher sensitivity, which cannot be integrated on the chip. Conventional methods of measuring phase noise or jitter cannot be qualified as autonomous, as they require an external frequency reference with very low phase noise or an external spectrum analyzer.

SUMMARY

A jitter meter device includes a capacitive element capable of being selectively charged, wherein the selection is made by a received signal from which an accumulated jitter value is to be determined. An analog-to-digital converter is coupled to the capacitive element to determine a voltage across the capacitive element after a number of cycles of the received signal. A determination module is coupled to the analog-to-digital converter to output the accumulated jitter value of the received signal using the voltage, wherein the accumulated jitter value is accumulated over the number of cycles.

A jitter meter device includes a switch serially coupled between a power supply and a capacitive element to selectively charge the capacitive element, wherein the selection is made by a received signal from which an accumulated jitter value is to be determined. An analog-to-digital converter is coupled to the capacitive element to determine a voltage across the capacitive element after a number of cycles of the received signal. A determination module is coupled to the analog-to-digital converter to output the accumulated jitter value of the received signal using the voltage, wherein the accumulated jitter value is accumulated over the number of cycles. The determination module also outputs a phase noise value of the received signal using the accumulated jitter value.

A method for measuring jitter includes selectively charging a capacitive element, wherein the selection is made by a received signal from which an accumulated jitter value is to be determined. A voltage across the capacitive element is determined after a number of cycles of the received signal. The accumulated jitter value of the received signal is outputted using the voltage, wherein the accumulated jitter value is accumulated over the number of cycles.

A method for measuring jitter includes switching a connection between a power supply and a capacitive element to selectively charge the capacitive element, wherein the selection is made by a received signal from which an accumulated jitter value is to be determined. A voltage across the capacitive element is determined after a number of cycles of the received signal. The accumulated jitter value of the received signal is outputted using the voltage, wherein the accumulated jitter value is accumulated over the number of cycles, and wherein outputting includes outputting a phase noise value of the received signal using the accumulated jitter value.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
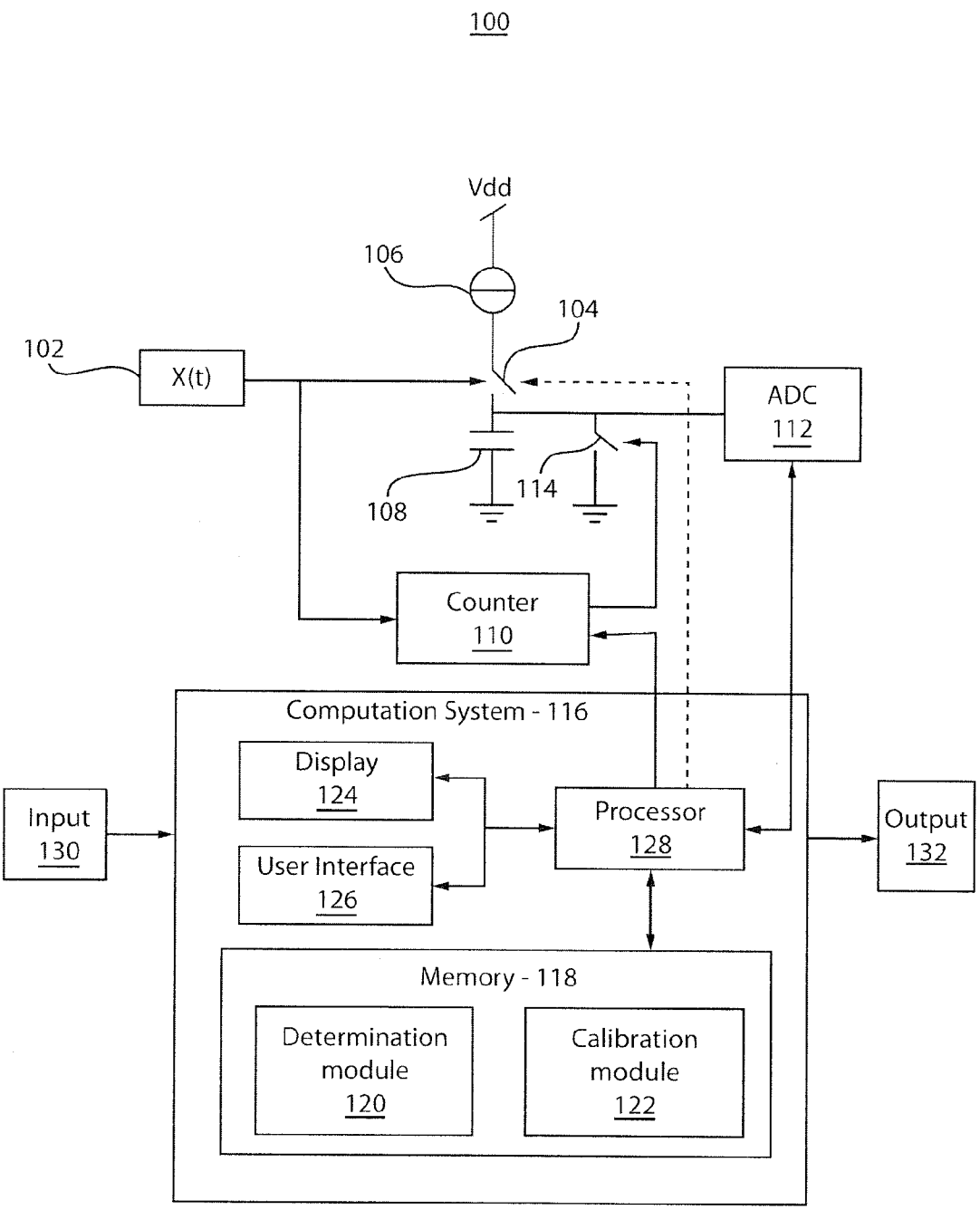
FIG. 1(A) illustratively depicts a block/flow diagram of a jitter meter in accordance with one embodiment.

In accordance with the present principles, systems and methods for measuring jitter and phase noise of a second order phase-locked loop (PLL) and a voltage controlled oscillator (VCO) are provided. In one embodiment, a jitter meter receives a signal, which includes the jitter and phase noise to be measured. The received signal may include the output of a PLL or a VCO. The received signal may be applied as a control signal to a switch of the jitter meter serially coupled between a current source and a capacitive element. When the received signal is high, the current source charges the capacitive element. When the received signal is low, the voltage across the capacitive element is held constant. After a predefined number of cycles, N, of the signal, the voltage across the capacitive element may be measured using a high resolution analog-to-digital converter (ADC). Using the voltage across the capacitive element, the cycle-to-cycle jitter and the jitter accumulated over N cycles of the received signal can be computed. Based on accumulated jitter, phase noise can also be computed.

The present principles allow jitter measurement at lower frequencies by storing long-term jitter in a DC voltage using a capacitor. Advantageously, the present principles do not require an accurate frequency reference signal and do not require calibrated delay lines. The analog functionality is also reduced to a minimum.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is also to be understood that the present invention will be described in terms of a given illustrative circuit architecture; however, other architectures, structures, substrate materials and process features and steps may be varied within the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1(A), a block/flow diagram of a jitter meter 100 is illustratively depicted in accordance with one embodiment. In one embodiment, the jitter meter 100 may be fabricated, at least in part, on one or more integrated circuit chips. The jitter meter 100 receives a signal 102. In a preferred embodiment, the signal 102 is the output of a (e.g., second order) PLL or VCO; however, other sources of the signal 102 are also contemplated. The signal 102 may be applied to the jitter meter 100 as the control signal x(t) to the switch 104. The signal 102 includes the jitter and phase noise to be measured. The signal 102 is preferably a periodic signal (e.g., rectangular signal) including time domain jitter as a consequence of phase noise. It is noted that the signal 102 may also include other types of signals within the scope of the present principles.

The switch 104 is serially coupled between a power supply or current source 106 and a capacitive element, such as capacitor 108. The capacitive element may include any element capable of being charged and discharged. When the signal 102 is high, the switch 104 is closed such that the current source 106 charges the capacitor 108. When the signal 102 is low, the switch 104 is open such that the value on the capacitor is held constant. In a preferred embodiment, current from the current source 106 is bandgap referenced (i.e., insensitive to temperature) and has low noise.

Figure 1B:
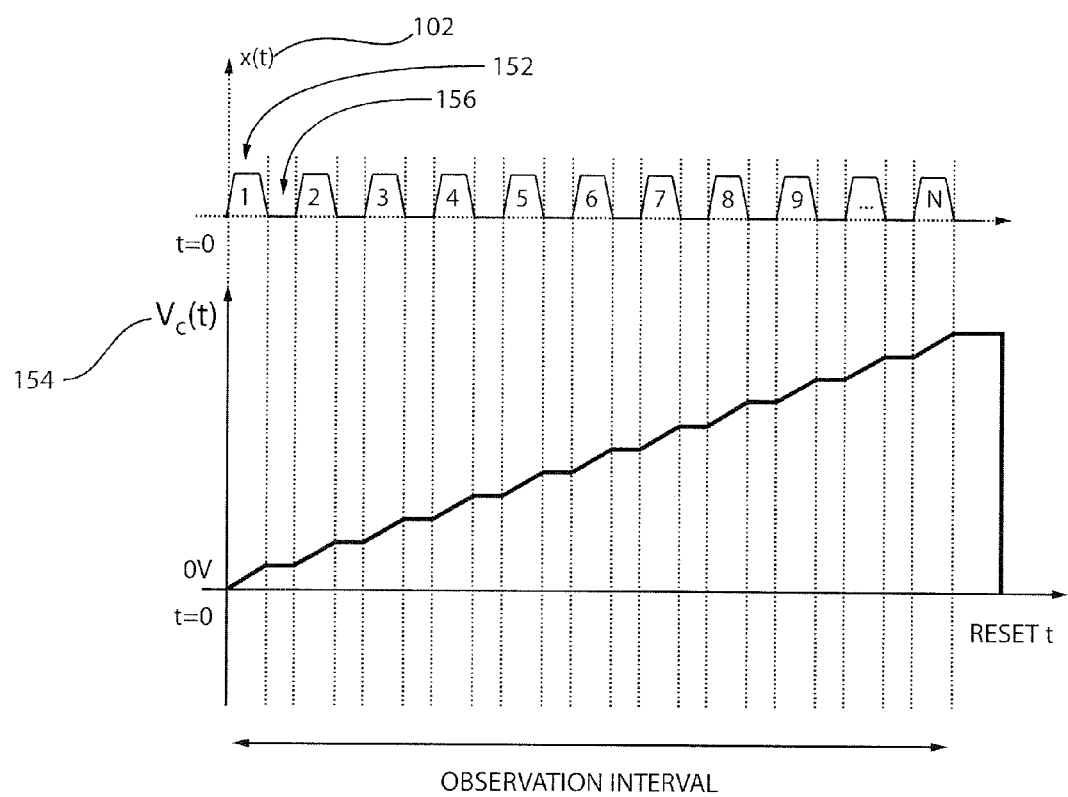
FIG. 1(B) illustratively depicts the relationship between the capacitor voltage and the output of the phase-locked loop as a function of time in accordance with one embodiment.

Referring for a moment to FIG. 1(B), with continued reference to FIG. 1(A), the relationship between the voltage 154 of the capacitor 108 and the received signal 102 is illustratively depicted in accordance with one embodiment. During a first cycle of the signal 102, when the signal 102 is high 152, the capacitor 108 is charged to a voltage 154. When the signal 102 is low 156, the voltage 154 on the capacitor 108 is held constant. The capacitor 108 is charged over N cycles of the signal 102.

Referring back to FIG. 1(A), the capacitor 108 may be charged over the observation interval of a predefined number of cycles, N, of the received signal 102 as counted by counter 110, where N is any positive integer. At the end of the observation interval, an analog-to-digital converter (ADC) 112 may sample the voltage across the capacitor 108. In a preferred embodiment, the ADC 112 includes a high resolution ADC. In other embodiments, the ADC 112 may include a low frequency successive-approximation-register (SAR) ADC or a sigma-delta ($\Sigma\Delta$) ADC. Other devices to determine the voltage across the capacitor 108 are also contemplated. The counter 110 then generates a reset signal to a reset switch 114 and the capacitor 108 is discharged to ground.

The jitter accumulated after the predefined number of cycles, N, can be determined using the values of $T_0$, N and $I_0/C$. The value of the period $T_0$ may be determined from the frequency of the signal 102. In a PLL, the frequency is set by the reference and the division ratio of the divider so that there is no need for a measurement to determine frequency. For a free running VCO, the value of the frequency is determined by placing the VCO in a PLL configuration for setting the value of its frequency. The VCO may then be returned to a free running mode by breaking the PLL loop. The value $I_0/C$ may be determined from a separate calibration procedure (e.g., using calibration module 122). Thus, the jitter accumulated after the predefined number of cycles, N, may be determined using, e.g., computation system 116. Using the jitter, computation system 116 may also compute phase noise.

Computation system 116 preferably includes one or more processors 128 and memory 118 for storing programs and applications. The system 116 may include one or more displays 124 for viewing, which may also permit a user to interact with the system 116 and its components and functions. This may be further facilitated by a user interface 126, which may include a keyboard, mouse, joystick or any other peripheral or control to permit user interaction with the system 116. It should be understood that the functions and components of the system 116 may be integrated into one or more systems.

The system 116 may receive data from the ADC 112, which may include the sampled voltage across the capacitor 108, and may be stored in the memory 118. The system 116 may also receive one or more inputs 130, which may involve the use of the display 124 and the user interface 126. The input 130 may include the predefined number of cycles, N, which may be transmitted to the counter 110 to indicate when to generate a reset signal. The input 130 may also include the period $T_0$, which is known from a frequency measurement. In addition, the input 130 may include the value $I_0/C$, which may be determined from a separate calibration procedure. A determination module 120 may determine jitter and phase noise of the received signal 102 as an output 132 by using the input 130 and the voltage of capacitor 108 from ADC 112. The determination module 120 may be stored in the memory 118. The output 132 may involve the use of the display 124 and the user interface 126.

In one embodiment, the system 116 includes a calibration module 122. The jitter meter 100 is preferably calibrated before any measurements are performed. The input range of the ADC 112 can be determined as (−FS/2, +FS/2). The ADC 112 is preferably a high resolution ADC, but does not require a large dynamic range. The system 116 may send a calibration signal (indicated by dashed line in FIG. 1(a)) to close the switch 104 to charge the capacitor 108 throughout the time interval (N·$T_0$). The voltage across the capacitor 108 is then measured by the ADC 112. The measured voltage value is affected by jitter and noise from the current source. The measurement is repeated over several iterations and the average measured voltage is determined as the expected value. The expected valued is the average value for a large number of experiments under the law of large numbers. From the expected value of the voltage of the capacitor 108, the value of $I_0/C$ can be determined.

The present principles store long-term jitter in a direct current voltage using the capacitor 108, which may be accurately measured with a, e.g., high resolution ADC 112. Advantageously, the present principles do not require an accurate frequency reference signal and do not require calibrated delay lines. The analog functionality is also reduced to a minimum.

Further details relating to the operation of jitter meter 100 will be discussed below with respect to a method for measuring jitter and phase noise 200 of FIG. 2.

Figure 2:
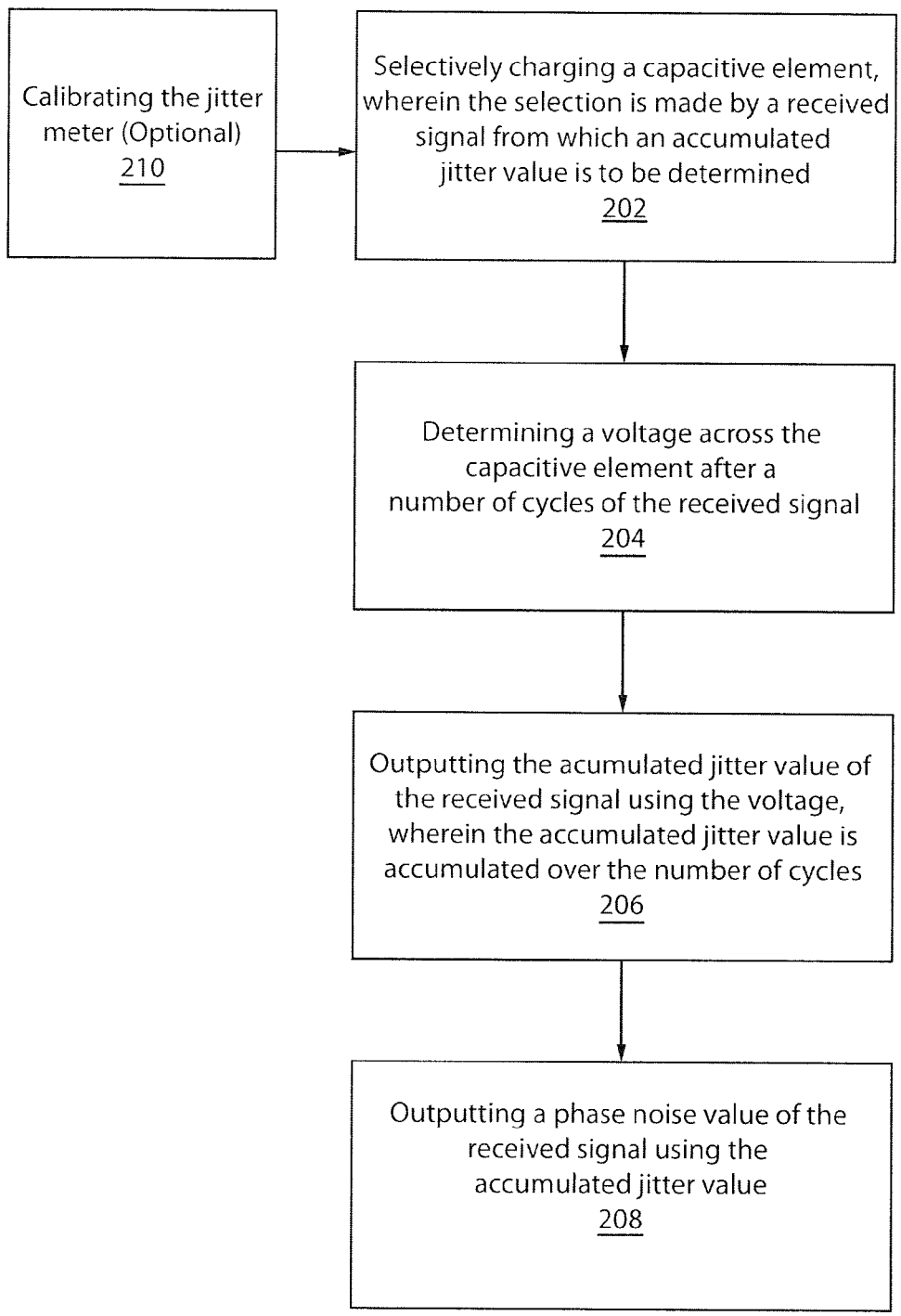
FIG. 2 illustratively depicts a block/flow diagram of a system/method of jitter and phase noise measurement, in accordance with one embodiment.

Referring now to FIG. 2, a block/flow diagram of a system/method of jitter and phase noise measurement is illustratively depicted in accordance with one embodiment. In block 202, a capacitive element is selectively charged, wherein the selection is made by a received signal from which an accumulated jitter value is to be determined. In one embodiment, the received signal may include an output of a (e.g., second order) PLL or a VCO. It is noted that other sources of the received signal have also been contemplated. The capacitive element may include any device capable of being charged and discharged. For example, in a preferred embodiment, the capacitive element is a capacitor. Selectively charging the capacitive element may include switching the connection between a power supply or current source and the capacitive element (e.g., capacitor), wherein the selection is made by the received signal. The received signal may include time domain jitter as a consequence of phase noise. The received signal is preferably a periodic signal (e.g., rectangular signal) in one embodiment; however, the received signal may also encompass other types of signals within the scope of the present principles. When the received signal is high, the switch closes to form a connection such that the current source charges the capacitor. When the received signal is low, the switch opens such that the voltage on the capacitor is held constant. In a preferred embodiment, current from the current source is bandgap referenced (i.e., insensitive to temperature) and has low noise.

In block 204, the voltage across the capacitive element is determined after a number of cycles, N, of the received signal. N may be any positive integer and may be received as an input. In one embodiment, an ADC is configured to sample the voltage across the capacitive element. In a preferred embodiment, the ADC is a high resolution ADC. In other embodiments, the ADC may be a low frequency successive-approximation-register (SAR) ADC or a sigma-delta ($\Sigma\Delta$) ADC. Other methods of determining the voltage across the capacitive element are also contemplated.

In block 206, the accumulated jitter value of the received signal is outputted using the voltage, wherein the accumulated jitter value is accumulated over the number of cycles, N. The voltage across the capacitive element can be expressed by V=Q/C, where V is the voltage of the capacitor, Q is charge and C is capacitance. Charge can be represented as Q=I·T, where I is current and T is time. Thus, for a first cycle of the received signal, the voltage on the capacitor is charged to a value represented by:

$$V_C = (T_0 + \Delta t_1) I_0 / C \quad (1)$$

where $T_0$ is the period and $\Delta t_1$ represents the cycle-to-cycle jitter for the received signal for the first cycle. $\Delta t_1$ can have a positive or negative value. After N cycles, the voltage on the capacitor is charged to a value represented by:

$$V_C = (N \cdot T_0 + \Delta t_n) I_0 / C \quad (2)$$

where N is the number of cycles and $\Delta t_N$ is the jitter accumulated during N clock cycles.

Using the value measured by, e.g., the high resolution ADC, the voltage across the capacitor may be determined. The number of cycles, N, is known as received as an input. The value of $I_0/C$ may be determined from a separate calibration procedure. The period $T_0$ may be determined from a frequency measurement as $T_0 = 1/f_0$. Thus, equation (2) may be solved for the accumulated jitter $\Delta t_n$ of the received signal.

In block 208, a phase noise value of the received signal is determined using the accumulated jitter value. When $N \cdot T_0 > 1/(\omega_n \cdot \zeta)$ where $\omega_n \cdot \zeta$ is the jitter bandwidth of the PLL, $\Delta t_n$ represents the saturated value of jitter due to jitter bandwidth of the PLL. In one embodiment, jitter bandwidth may be known from the PLL design or may be computed using a digital state machine. Thus, $\Delta t_n$ can be treated as a random variable with a variance $\sigma^2_{\Delta tn} = N \cdot \sigma^2_{cycle-to-cycle jitter}$. To compute the variance of the jitter $\sigma^2_{\Delta tn}$, the jitter is determined several (e.g., statistically large number) times.

For a linearized model of a second order PLL, the jitter generation function is:

$$\frac{\varphi_{out}}{\varphi_{Nvco}} = \frac{s^2}{s^2 + 2\xi\overline{\omega}_n s + \omega_n^2}. \quad (3)$$

Thus, the power spectral density of the VCO phase noise, represented as $S\phi_{VCO}(f)$, is shaped by the jitter generation function of equation (3), to determine the power spectral density of the PLL phase noise, $S\phi_{PLL}(f)$, as in equation (4).

$$S_{\varphi PLL}(f) = \left| \frac{s^2}{s^2 + 2\xi\overline{\omega}_n s + \omega_n^2} \right|^2_{s=j2\pi 2} S_{\varphi VCO}(f). \quad (4)$$

In the −20 dB/decade, the power spectral density of the VCO phase noise can be approximated as $N_{VCO}/f^2$, resulting in equation (5).

$$S_{\varphi PLL}(f) = \left| \frac{s^2}{s^2 + 2\xi\overline{\omega}_n s + \omega_n^2} \right|^2_{s=j2\pi 2} N_{VCO}/f^2. \quad (5)$$

Using equation (5), jitter is determined in the time domain.

Jitter is measured at the zero crossings between two or more periods. At the first zero crossing:

$$2\pi f_0 t_1 + \phi(t_1) = 0 \quad (6)$$

and at the Nth zero crossing:

$$2\pi f_0 t_2 + \phi(t_2) = 2\pi N. \quad (7)$$

The time between times $t_1$ and $t_2$ may be expressed as:

$$t_2 - t_1 = N \cdot T_0 + \Delta t \quad (8)$$

where $\Delta t$ is the jitter accumulated after N periods. By equations (6), (7) and (8), accumulated jitter can be expressed by:

$$\Delta t = [\phi(t_1) - \phi(t_2)] T_0 / 2\pi. \quad (9)$$

Noise variance can be expressed as:

$$\sigma^2_{\Delta t} = E[\Delta t^2] - E[\Delta t]^2 = \overline{\Delta t^2} - (\overline{\Delta t})^2 \quad (10)$$

where jitter has zero mean:

$$\overline{\Delta t} = 0. \quad (11)$$

By equations (9), (10) and (11), noise variance can be expressed as:

$$\sigma^2_{\Delta t} = E[\Delta t^2] = E\{[\phi^2(t_1) - 2\phi\phi(_2) + \phi^2(t_2)]\} \cdot T_0^2 / 4\pi^2. \quad (12)$$

Equation (12) can then be simplified into:

$$\sigma^2_{\Delta t} = E[\Delta t^2] = \{E[\phi^2(t_1)] - 2E[\phi(t_1) \cdot \phi(t_2)] + E[\phi^2(t_2)]\} \cdot T_0^2 / 4\pi^2. \quad (13)$$

Since $\phi(t_1)$ is a wide-sense stationary process:

$$E[\varphi^2(t_1)] = E[\varphi^2(t_2)] = \int_{-\infty}^{\infty} S_{\varphi PLL}(f) df \quad (14)$$

and $$E[\varphi^2(t_1)\varphi^2(t_2)] = R_\varphi(t_2 - t_1) \quad (15)$$

$$= R_\varphi\left(\tau\tau = \int_{-\infty}^{\infty} S_{\varphi PLL}(f) \cos(2\pi f \tau) df\right).$$

From equations (13) and (15), the time domain jitter is derived as follows:

$$\sigma_{\Delta T} = \sqrt{\frac{4}{\omega_0^2} \int_{-\infty}^{\infty} \frac{N_{VCO}}{f^2} \left| \frac{s^2}{s^2 + 2\zeta\omega_n s + \omega_n^2} \right|^2_{s=j2\pi} \sin^2(\pi \Delta T) df} \quad (16)$$

The integral in equation (16) has a closed analytical form. Applying Cauchy's residue theorem for a very long observation interval results in two particular cases, expressed in equation (17).

$$\lim_{\Delta T \to \infty} \sigma^2 \Delta T = \frac{N_{VCO}}{2 f_0^2 \cdot \omega_n \cdot \zeta} \quad \text{for } \zeta \gg 1 \quad (17)$$

$$\lim_{\Delta T \to \infty} \sigma^2 \Delta T = \frac{N_{VCO}}{f_0^2 \cdot \omega_n \cdot \zeta} \quad \text{for } 0 \leq \zeta \leq 1$$

The product $\omega_n \cdot \zeta$ is the jitter bandwidth of the PLL. Therefore, long term jitter depends only on the VCO phase noise $N_{VCO}$, the damping factor $\zeta$, the natural frequency $\omega_n$, and oscillation frequency $f_0$.

Before its saturation, the power of the accumulated jitter depends on the cycle-to-cycle jitter as follows:

$$\sigma^2_{\Delta T} = N \cdot \sigma^2_{cycle-to-cycle\, jitter} \quad (18)$$

The value of the accumulated jitter can be approximated as a hard saturation given by equation (17). Thus, the cycle-to-cycle jitter can be determined as follows in equation (19).

$$\sigma^2_{cycle-to-cycle\, jitter} = \frac{N_{VCO}}{2N \cdot f_0^2 \cdot \omega_n \cdot \zeta} \quad \text{for } \zeta \gg 1 \quad (19)$$

$$\sigma^2_{cycle-to-cycle\, jitter} = \frac{N_{VCO}}{N \cdot f_0^2 \cdot \omega_n \cdot \zeta} \quad \text{for } 0 \leq \zeta \leq 1$$

Phase noise of the PLL, $L(f_m)$, can be represented at a specific frequency offset $f_m$ as follows:

$$L(f_m) = S_\varphi(f_m) = \frac{N_{VCO}}{2 f_m^2}. \quad (20)$$

Using the measured accumulated jitter, the phase noise of the PLL, $L(f_m)$, is determined to be equation (21).

$$L(f_m) = \frac{\sigma^2 \Delta T \cdot f_0^2 \cdot \omega_n \cdot \zeta}{f_m^2} \quad \text{for } \zeta > 1 \quad (21)$$

$$L(f_m) = \frac{\sigma^2 \Delta T \cdot f_0^2 \cdot \omega_n \cdot \zeta}{2 f_m^2} \quad \text{for } 0 \leq \zeta \leq 1$$

In block 210, the jitter meter is optionally calibrated before measurements are made, in accordance with one embodiment. The input range of the ADC may be determined as (−FS/2, +FS/2). The ADC preferably includes a high resolution ADC, but does not require a large dynamic range. The value of $I_0/C$ for the time interval ($N \cdot T_0$) may be determined to extract $\Delta_{Tn}$ from $V = (N \cdot T_0 + \Delta_{Tn}) I_0/C$.

The capacitor is constantly charged using the current source throughout the time interval ($N \cdot T_0$). The measured voltage is affected by jitter and the $I_0/C$ value. The measurement is repeated over several iterations (e.g., a statistically large number of experiments) and the average measured voltage is determined as the expected value. The expected value is the average value for a large number of experiments under the law of large numbers. Thus, after many experiments, the average voltage across the capacitor may be expressed as the expected value $E[(N \cdot T_0 + \Delta_{Tn}) I_0/C]$ as in equation (22).

$$E[(N \cdot T_0 + \Delta_{Tn}) I_0/C] = E[T_0 \cdot I_0/C] + E[\Delta_{Tn} \cdot (I_0/C)] \quad (22)$$

$$= T_0 \cdot E[I_0/C] + E[\Delta_{Tn} \cdot (I_0/C)]$$

Since jitter and current source noise are two independent processes:

$$E[\Delta_{Tn} \cdot (I_0/C)] = E[\Delta_{Tn}] \cdot E[I_0/C]. \quad (23)$$

Jitter has zero mean such that $E[\Delta_{Tn}] = 0$. Thus, the expected value of $I_0/C$ is:

$$E[I_0/C] = E[(N \cdot T_0 + \Delta_{Tn}) I_0/C]/T_0. \quad (24)$$

Under the law of large numbers, the expected value is equal to the average value for a large number of experiments, so that $I_0/C$ can be replaced by $E[I_0/C]$ in $V = (N \cdot T_0 + \Delta_{Tn}) I_0/C$. Thus, accumulated jitter may be calculated as follows:

$$\Delta_{Tn} = (V/E[I_0/C]) - N \cdot T_0 \quad (25)$$

where V is the voltage reading of the ADC at the end of the integration interval. Repeating this measurement, the average value of jitter, the standard deviation and its power can be computed.

Having described preferred embodiments of a system and method for universal jitter meter and phase noise measurement (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A jitter meter device, comprising:
 a switch serially coupled to a current source;
 a capacitive element configured to be selectively charged through the switch by the current source when the switch is closed, wherein both a selection of when the capacitive element is charged and a selection of when the switch is closed is made by a received signal from which an accumulated jitter value is to be determined and which is applied to the switch as a control signal, and wherein the selections are based on a particular magnitude value of the received signal, wherein the switch is closed and charging only occurs at times when the received signal is high;
 an analog-to-digital converter coupled to the capacitive element to determine a voltage across the capacitive element after a number of cycles of the received signal;
 a jitter computation device, having a processor and memory, coupled to the analog-to-digital converter to output the accumulated jitter value of the received signal using the voltage, wherein the accumulated jitter value is accumulated over the number of cycles; and
 a counter coupled to the jitter computation device to determine the number of cycles of the received signal.

2. The device as recited in claim 1, wherein the jitter computation device outputs a phase noise value of the received signal using the accumulated jitter value.

3. The device as recited in claim 1, further comprising a reset switch in parallel with the capacitive element to discharge the capacitive element to ground upon receiving a reset signal of the counter.

4. The device as recited in claim 3, wherein the counter sends the reset signal to the reset switch when the counted number of cycles reaches the number of cycles of the received signal.

5. The device as recited in claim 1, wherein:
when the received signal is low, the switch is open such that the voltage across the capacitive element is held constant.

6. The device as recited in claim 1, wherein the jitter computation device is configured to compute an average of the voltage across the capacitive element for two or more iterations, wherein, for each iteration, the capacitive element is constantly charged over a time interval and subsequently discharged.

7. The device as recited in claim 1, wherein the received signal is an output of at least one of a phase-locked loop and a voltage-controlled oscillator.

8. The device as recited in claim 1, wherein the received signal is a rectangular periodic signal.

9. A jitter meter device, comprising:
a switch serially coupled between a power supply and a capacitive element to selectively charge the capacitive element when the switch is closed, wherein both a selection of when the capacitive element is charged and a selection of when the switch is closed is made by a received signal from which an accumulated jitter value is to be determined and which is applied to the switch as a control signal, and wherein the selections are based on a particular magnitude value of the received signal, wherein the switch is closed and charging only occurs at times when the received signal is high;
an analog-to-digital converter coupled to the capacitive element to determine a voltage across the capacitive element after a number of cycles of the received signal;
a jitter computation device having a processor and memory, coupled to the analog-to- digital converter to output the accumulated jitter value of the received signal using the voltage, wherein the accumulated jitter value is accumulated over the number of cycles, and wherein the jitter computation device outputs a phase noise value of the received signal using the accumulated jitter value; and
a counter coupled to the jitter computation device to determine the number of cycles of the received signal.

10. The device as recited in claim 9, wherein the counter sends a reset signal to a reset switch when the counted number of cycles reaches the number of cycles, and wherein the reset switch discharges the capacitive element to ground upon receiving the reset signal.

11. The device as recited in claim 9, wherein the jitter computation device is configured to compute an average of the voltage across the capacitive element for two or more iterations, wherein, for each iteration, the capacitive element is constantly charged over a time interval and subsequently discharged.

12. In a jitter meter device, a method for measuring jitter, comprising:
selectively charging a capacitive element through a switch coupled to a current source when the switch is closed, wherein both a selection of when the capacitive element is charged and a selection of when the switch is closed is made by a received signal from which an accumulated jitter value is to be determined and which is applied to the switch as a control signal, and wherein the selections are based on a particular magnitude value of the received signal, wherein the switch is closed and charging only occurs at times when the received signal is high;
determining a number of cycles of the received signal;
determining, by an analog-to-digital converter, a voltage across the capacitive element after the number of cycles of the received signal; and
outputting, by a jitter determination device having a processor and a memory, the accumulated jitter value of the received signal using the voltage, wherein the accumulated jitter value is accumulated over the number of cycles.

13. The method as recited in claim 12, further comprising outputting a phase noise value of the received signal using the accumulated jitter value.

14. The method as recited in claim 12, further comprising discharging the capacitive element to ground upon receiving a reset signal.

15. The method as recited in claim 14, further comprising sending the reset signal when the counted number of cycles reaches the number of cycles of the received signal.

16. The method as recited in claim 12, further comprising switching a connection made by the switch between the current source and the capacitive element to selectively charge the capacitive element.

17. The method as recited in claim 16, wherein selectively charging the capacitive element includes:
when the received signal is low, the connection is open such that the voltage across the capacitive element is held constant.

18. The method as recited in claim 12, further comprising:
computing an average of the voltage across the capacitive element for two or more iterations, wherein, for each iteration, the capacitive element is constantly charged for a time interval and subsequently discharged.

19. The method as recited in claim 12, wherein the received signal is an output of at least one of a phase-locked loop and a voltage-controlled oscillator.

20. The method as recited in claim 12, wherein the received signal is a rectangular periodic signal.

21. In a jitter meter device, a method for measuring jitter, comprising:
switching a connection between a power supply and a capacitive element to selectively charge the capacitive element, wherein both a selection of when the capacitive element is charged and a selection of when the connection is closed for charging the capacitive element is made by a received signal from which an accumulated jitter value is to be determined and which is applied to the connection as a control signal, and wherein the selections are based on a particular magnitude value of the received signal, wherein the connection is closed and charging only occurs at times when the received signal is high;
determining a number of cycles of the received signal;
determining, by an analog-to-digital converter, a voltage across the capacitive element after the number of cycles of the received signal; and
outputting, by a jitter determination device having a processor and a memory, the accumulated jitter value of the received signal using the voltage, wherein the accumulated jitter value is accumulated over the number of cycles, and wherein outputting includes outputting a phase noise value of the received signal using the accumulated jitter value.

22. The method as recited in claim 21, further comprising: computing an average of the voltage across the capacitive element for two or more iterations, wherein, for each iteration, the capacitive element is constantly charged over a time interval and subsequently discharged.

\* \* \* \* \*